United States Patent
Liu et al.

(10) Patent No.: US 8,050,129 B2
(45) Date of Patent: Nov. 1, 2011

(54) E-FUSE APPARATUS FOR CONTROLLING REFERENCE VOLTAGE REQUIRED FOR PROGRAMMING/READING E-FUSE MACRO IN AN INTEGRATED CIRCUIT VIA SWITCH DEVICE IN THE SAME INTEGRATED CIRCUIT

(75) Inventors: Chia-Hsien Liu, Taichung (TW);
Rei-Fu Huang, Hsinchu (TW);
Chien-Chung Chen, Hsinchu (TW);
Che-Yuan Jao, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 259 days.

(21) Appl. No.: 12/491,247

(22) Filed: Jun. 25, 2009

(65) Prior Publication Data
US 2010/0328987 A1    Dec. 30, 2010

(51) Int. Cl.
*G11C 7/00*    (2006.01)
(52) U.S. Cl. ........ 365/225.7; 365/96; 365/226; 365/227

(58) Field of Classification Search .................... 365/96, 365/225.7, 226, 227
See application file for complete search history.

(56) References Cited

U.S. PATENT DOCUMENTS

| | | | |
|---|---|---|---|
| 5,448,187 A | 9/1995 | Kowalski | |
| 6,680,873 B2 * | 1/2004 | Muraoka et al. | 365/225.7 |
| 7,254,078 B1 | 8/2007 | Park | |
| 7,336,095 B2 | 2/2008 | Erickson | |
| 7,394,713 B2 * | 7/2008 | Knopf et al. | 365/225.7 |
| 7,626,881 B2 * | 12/2009 | Tomita | 365/225.7 |
| 2007/0058473 A1 | 3/2007 | Kouchi | |

* cited by examiner

*Primary Examiner* — VanThu Nguyen
(74) *Attorney, Agent, or Firm* — Winston Hsu; Scott Margo (57) ABSTRACT

An electrically programmable fuse (e-fuse) apparatus includes an e-fuse macro and a switch device. The e-fuse macro is disposed in an integrated circuit, and has a plurality of e-fuse units. The switch device is disposed in the integrated circuit, and has an output node coupled to the e-fuse units and a first input node coupled to a first power source which supplies a first reference voltage acting as a programming voltage of the e-fuse macro. The switch device connects the first power source to the e-fuse units when the e-fuse macro is operated under a programming mode.

16 Claims, 11 Drawing Sheets

E-FUSE APPARATUS FOR CONTROLLING REFERENCE VOLTAGE REQUIRED FOR PROGRAMMING/READING E-FUSE MACRO IN AN INTEGRATED CIRCUIT VIA SWITCH DEVICE IN THE SAME INTEGRATED CIRCUIT

BACKGROUND

The disclosed embodiments relate to one-time-programmable (OTP) storage apparatuses, and more particularly, to electrically programmable fuse (e-fuse) apparatuses which control a reference voltage required for programming/reading an e-fuse macro in an integrated circuit via a switch device implemented in the same integrated circuit.

Electrically programmable fuse (e-fuse) apparatuses are one-time-programmable (OTP) storage apparatuses widely used in semiconductor devices to record customized data (e.g., a chip ID or serial number) or repair defective elements inevitably remaining in the integrated circuits due to the semiconductor process. As the e-fuse apparatuses have become essential components to integrated circuits, how to design the e-fuse apparatus therefore becomes an important topic to circuit designers.

SUMMARY

In accordance with embodiments of the present invention, exemplary e-fuse apparatuses each capable of controlling a reference voltage required for programming/reading an e-fuse macro in an integrated circuit via a switch device in the same integrated circuit are proposed.

According to a first aspect of the present invention, an electrically programmable fuse (e-fuse) apparatus is disclosed. The e-fuse apparatus includes an e-fuse macro and a switch device. The e-fuse macro is disposed in an integrated circuit, and has a plurality of e-fuse units. The switch device is also disposed in the integrated circuit, and has an output node coupled to the e-fuse units and a first input node coupled to a first power source which supplies a first reference voltage acting as a programming voltage of the e-fuse macro. The switch device connects the first power source to the e-fuse units when the e-fuse macro is operated under a programming mode.

According to a second aspect of the present invention, another electrically programmable fuse (e-fuse) apparatus is disclosed. The e-fuse apparatus includes an e-fuse macro and a switch device. The e-fuse macro is disposed in an integrated circuit, and has a plurality of e-fuse units. The switch device is also disposed in the integrated circuit, and has an output node coupled to the e-fuse units and an input node coupled to a power source which supplies a reference voltage. The switch device connects the power source to the e-fuse units when the e-fuse macro is operated under a read mode, the power source is external to the integrated circuit, and the switch device is coupled to the power source via a specific pin of the integrated circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

In accordance with embodiments of the present invention, exemplary e-fuse apparatuses each capable of controlling a reference voltage required for programming/reading an e-fuse macro in an integrated circuit via a switch device implemented in the same integrated circuit are proposed. As the switch device used for control the reference voltage fed into the e-fuse macro is disposed in the same integrated circuit where the e-fuse macro is located, the e-fuse apparatus can be controlled more easily, efficiently, and/or accurately. For clarity, certain exemplary implementations of the e-fuse apparatus are given as follows.

Figure 1:
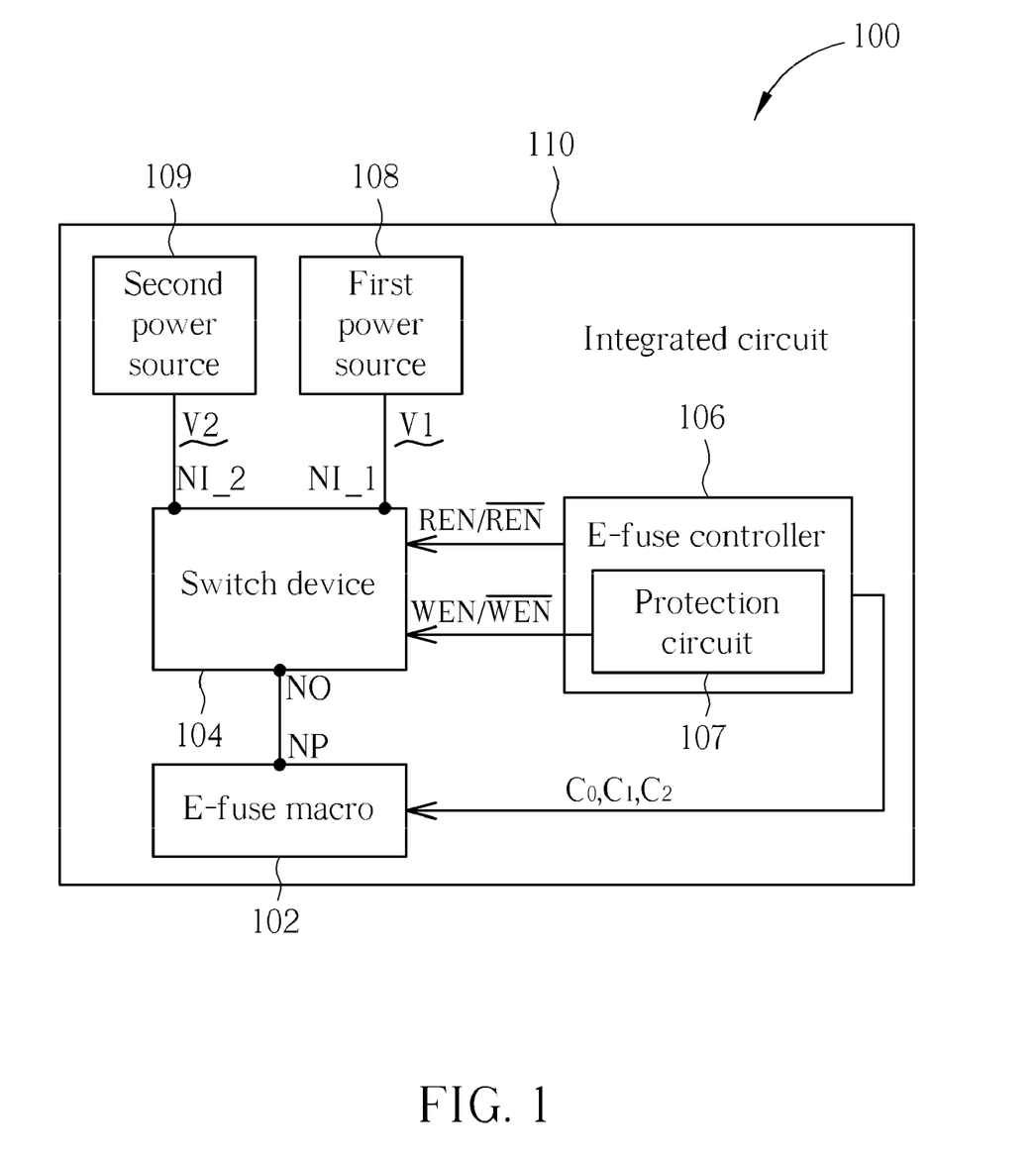
FIG. 1 is a diagram illustrating a first exemplary implementation of an e-fuse apparatus according to the present invention.

FIG. 1 is a diagram illustrating a first exemplary implementation of an e-fuse apparatus according to the present invention. The exemplary e-fuse apparatus 100 includes, but is not limited to, an e-fuse macro 102, a switch device 104, an e-fuse controller 106, a first power source 108, and a second power source 109. In this exemplary embodiment, the e-fuse macro 102, the switch device 104, the e-fuse controller 106, the first power source 108, and the second power source 109 are all disposed in an integrated circuit 110. The first power source 108 supplies a first reference voltage V1 acting as a programming voltage of the e-fuse macro 102, and the second power source 109 supplies a second reference voltage V2 different from the first reference voltage V1. Specifically, the first reference voltage V1 is required for programming the e-fuse macro 102 under a programming mode, and the second reference voltage V2 is required for reading the e-fuse macro 102 under a read mode. With regard to the first power source 108 which supplies the first reference voltage V1, it can be selected from the existing internal power sources of the integrated circuit 110 to meet the programming requirement.

Figure 2:
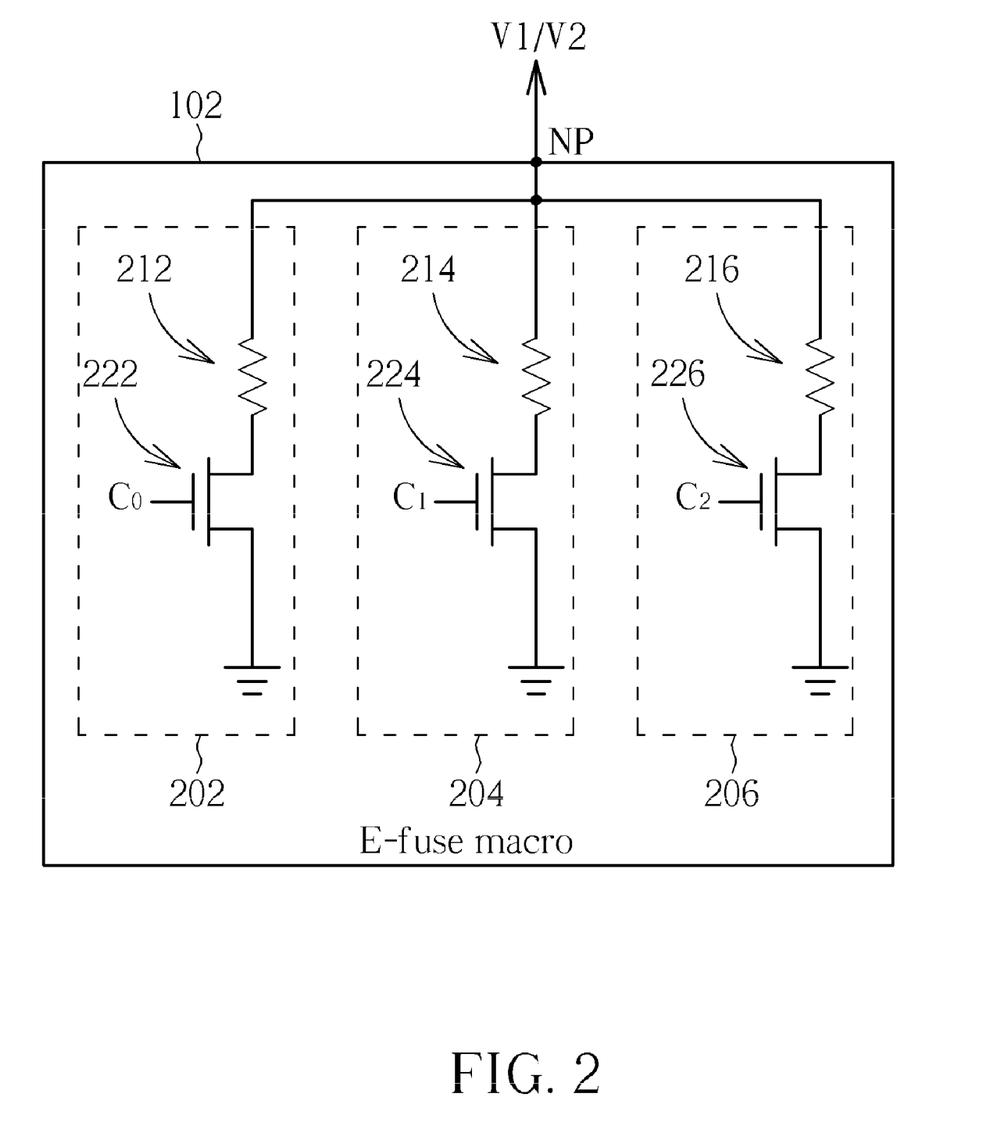
FIG. 2 is a diagram illustrating an exemplary embodiment of an e-fuse macro shown in FIG. 1.
Figure 3:
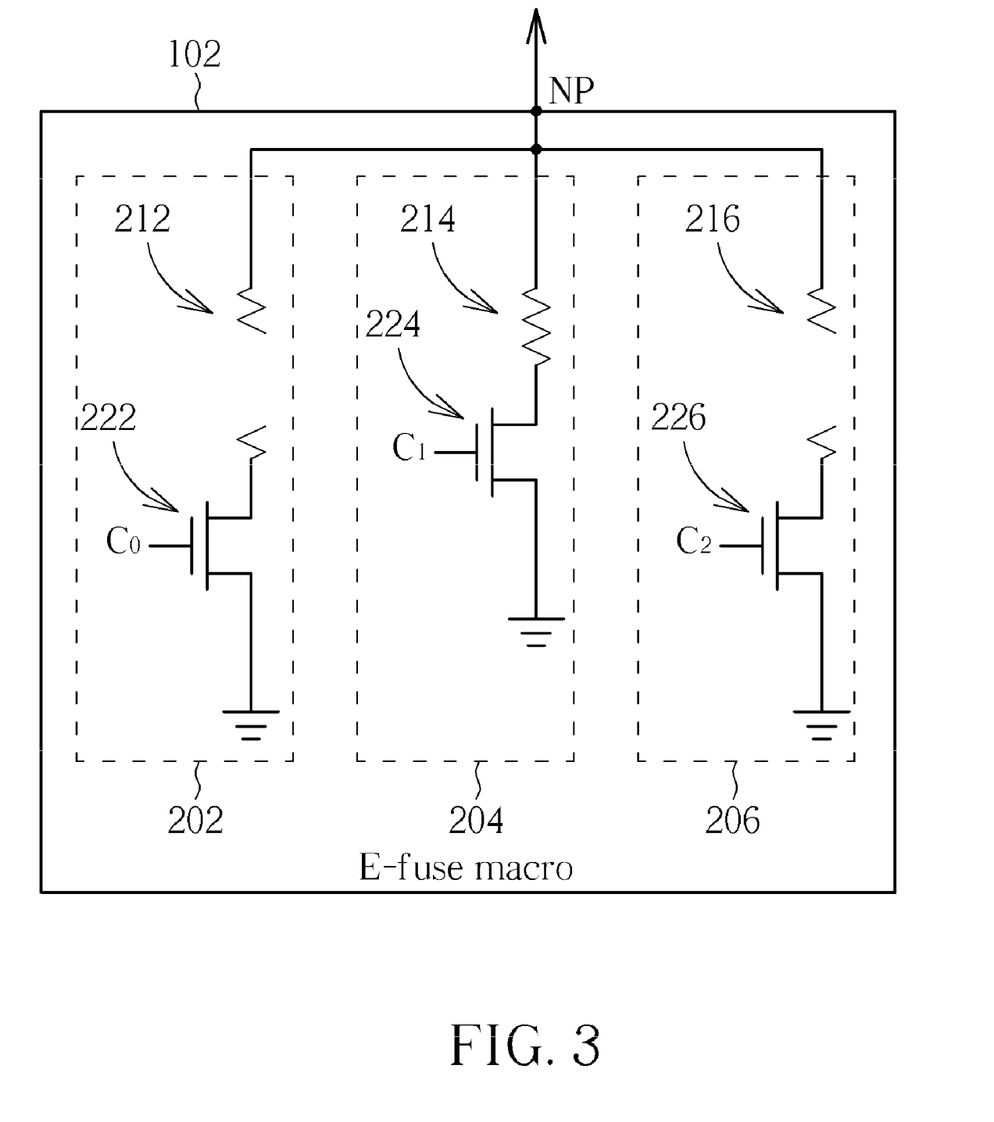
FIG. 3 shows a programming result of the e-fuse macro shown in FIG. 2.

FIG. 2 is a diagram illustrating an exemplary embodiment of the e-fuse macro 102 shown in FIG. 1. Byway of example, not a limitation, the e-fuse macro 102 includes a plurality of e-fuse units 202, 204, and 206. It should be noted that only three e-fuse units are shown in FIG. 2 for simplicity. Each of the e-fuse units 202, 204, and 206 includes a programmable fuse element 212, 214, 216 and a control element 222, 224, 226, where the control elements 222, 224, and 226 are simply implemented using metal-oxide semiconductor (MOS) transistors. Before the e-fuse macro 102 is programmed, none of the programmable fuse elements 212, 214, 216 is blown. When the e-fuse macro 102 is operated under a programming mode, a programming voltage (e.g., the first reference voltage V1 being 3.3V or 2.5V) will be fed into a power connection node NP of the e-fuse macro 102. Each of the control elements 222, 224, and 226 is controlled by a corresponding control signal $C_0$, $C_1$, $C_2$ generated by the e-fuse controller 106 to determine whether a corresponding programmable fuse element 212, 214, 216 should be blown. More specifically, each of the e-fuse units 202, 204, and 206 stores "0" or "1" according to the resistance state. For example, in a case where the e-fuse units 202, 204, and 206 are required to store "1", "0", and "1", respectively, the control elements (e.g., NMOS transistors) 222 and 226 are turned on by the control signals $C_0$ and $C_2$, and the control element (e.g., an NMOS transistor) 224 is turned off by the control signals $C_1$. Therefore, a large electrical current resulted from the applied programming voltage at the power connection node NP flows through each of the programmable fuse element 212 and 216 due to the electrically conductive control element 222, 226. As a result, the programmable fuse elements 212 and 216 are blown due to sufficient heat dissipation caused by the large electrical current. The programming result of the e-fuse macro 102 is shown in FIG. 3.

When the e-fuse macro 102 is operated under a read mode, the second reference voltage V2 (e.g., 0V) will be supplied to the power connection node NP of the e-fuse macro 102. As clearly shown in FIG. 3, the e-fuse units 202 and 206 have high resistance, and the e-fuse unit 204 has low resistance. Therefore, based on the instant resistance state of each e-fuse unit, the data read from the e-fuse macro 102 would include three bits "1", "0", and "1".

It should be noted that the aforementioned voltage levels of the first reference voltage V1 and the second reference voltage V2 are for illustrative purposes only. In an actual application, the voltage levels of the first reference voltage V1 and the second reference voltage V2 depend on the semiconductor process and the operational condition.

As mentioned above, the power connection node NP of the e-fuse macro 102 receives either the first reference voltage V1 or the second reference voltage V2, depending upon the operational mode of the e-fuse macro 102. In this exemplary embodiment, the delivery of the first reference voltage V1 supplied to the power connection node NP of the e-fuse macro 102 under the programming mode and the second reference voltage V2 supplied to the power connection node NP of the e-fuse macro 102 under the read mode are controlled by the switch device 104 implemented in the integrated circuit 110. As shown in FIG. 1, the switch device 104 has an output node NO coupled to the e-fuse units 202, 204, 206 via the power connection node NP, a first input node NI_1 coupled to the first power source 108 which supplies the first reference voltage V1, and a second input node NI_2 coupled to the second power source 109 which supplies the second reference voltage V2. The switch device 104 is therefore implemented to connect the first power source 108 to the e-fuse units 202, 204, 206 when the e-fuse macro 102 is operated under the programming mode, and connect the second power source 108, instead of the first power source 108, to the e-fuse units 202, 204, 206 when the e-fuse macro 102 is operated under the read mode.

Figure 4:
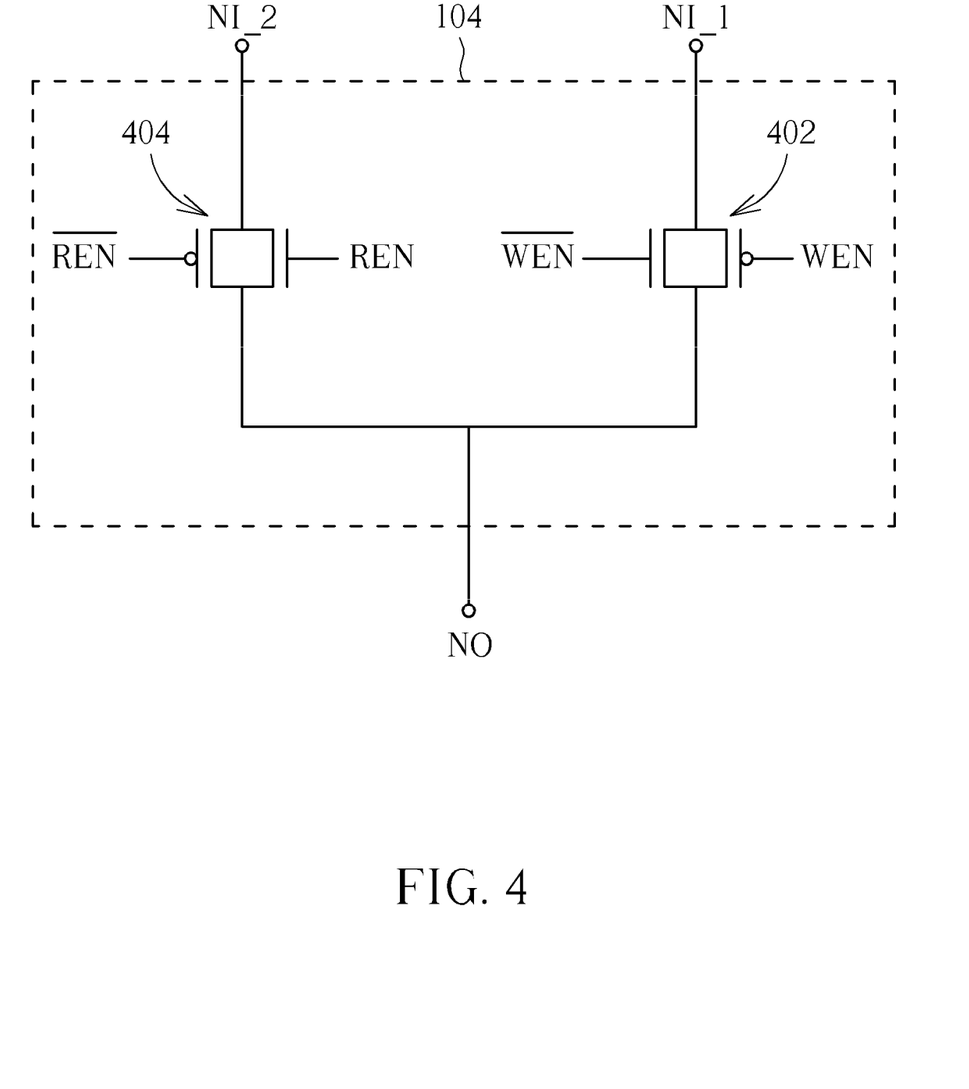
FIG. 4 is a diagram illustrating a first exemplary embodiment of a switch device shown in FIG. 1.

FIG. 4 is a diagram illustrating a first exemplary embodiment of the switch device 104 shown in FIG. 1. The exemplary switch device 104 includes a first transmission gate 402 controlled by control signals WEN/$\overline{\text{WEN}}$ generated by the e-fuse controller 106 and a second transmission gate 404 controlled by control signals REN/$\overline{\text{REN}}$ generated by the e-fuse controller 106. The first transmission gate 402 is coupled between the first input node NI_1 and the output node NO (which is further coupled to the power connection node NP), where the first transmission gate 402 is turned on when the e-fuse macro 102 is operated under the programming mode. The second transmission gate 404 is coupled between the second input node NI_2 and the output node NO (which is further coupled to the power connection node NP), where the second transmission gate 404 is turned on when the e-fuse macro 102 is operated under the read mode.

Figure 5:
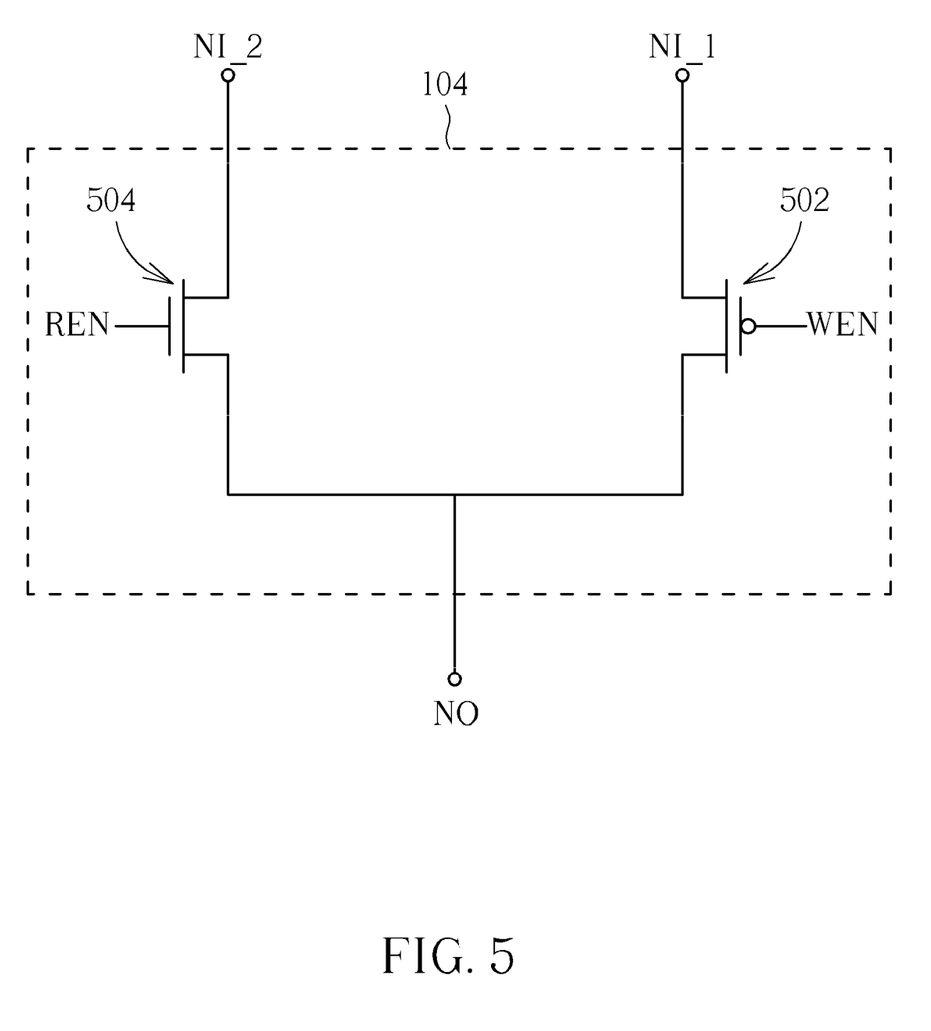
FIG. 5 is a diagram illustrating a second exemplary embodiment of the switch device shown in FIG. 1.

FIG. 5 is a diagram illustrating a second exemplary embodiment of the switch device 104 shown in FIG. 1. The exemplary switch device 104 includes a first transistor (e.g., a PMOS transistor) 504 controlled by a control signal WEN generated by the e-fuse controller 106 and a second transistor (e.g., an NMOS transistor) 504 controlled by a control signal REN generated by the e-fuse controller 106. The first transistor 502 is coupled between the first input node NI_1 and the output node NO (which is further coupled to the power connection node NP), where the first transistor 502 is turned on when the e-fuse macro 102 is operated under the programming mode. The second transistor 504 is coupled between the second input node NI_2 and the output node NO (which is further coupled to the power connection node NP), where the second transistor 504 is turned on when the e-fuse macro 102 is operated under the read mode.

As shown in FIG. 1, the e-fuse controller 106 contains a protection circuit 107 implemented for preventing the switch device 104 from connecting the first power source 108 to the e-fuse units 202, 204, 206 of the e-fuse macro 102 unless a predetermined criterion is met. In this exemplary implementation, the first input node NI_1 continuously receives the first reference voltage V1 (e.g., a high voltage level) when the first power source 108 is a constant voltage source which keeps outputting the first reference voltage V1. If the switch device 104 is erroneously turned on due to unexpected factors, the e-fuse units 202, 204, 206 of the e-fuse macro 102 may be incorrectly blown to store erroneous data. Therefore, the protection circuit 107 is implemented to guarantee that the switch device 104 does not deliver the first reference voltage V1 to the e-fuse macro 102 until the e-fuse macro 102 is ready to be programmed. For example, before a correct 16-bit password is inputted to the protection circuit 107 to unlock the programming protection, the protection circuit 107 forces the first transmission gate 402 to remain at an off status by properly setting the control signals WEN/$\overline{\text{WEN}}$ or forces the first transistor 502 to remain at an off status by properly setting the control signal WEN. Please note that the protection circuit 107 is an optional component, and may be omitted in other exemplary embodiments of the present invention.

Regarding the exemplary implementation shown in FIG. 1, the second reference voltage V2 (e.g., the ground voltage) has to be supplied to the power connection node NP to correctly read out the data stored in the e-fuse macro 102. However, if the e-fuse macro itself can provide the reference voltage required under the read mode, no additional external reference voltage is required to be supplied to the e-fuse macro operated under the read mode. Please refer to FIG. 6, which is a diagram illustrating a second exemplary implementation of an e-fuse apparatus according to the present invention. The exemplary e-fuse apparatus 600 includes, but is not limited to, an e-fuse macro 602, a switch device 604, an e-fuse controller 606, and a power source 608. In this exemplary embodiment, the e-fuse macro 602, the switch device 604, the e-fuse controller 606, and the power source 608 are all disposed in an integrated circuit 610. The power source 608 supplies a reference voltage V1 acting as a programming voltage of the e-fuse macro 602. Please note that no external reference voltage required under a read mode is supplied to the power connection node NP of the e-fuse macro 102. FIG. 7 is a diagram illustrating an exemplary embodiment of the e-fuse macro 602 shown in FIG. 6. By way of example, not a limitation, the e-fuse macro 602 includes aforementioned e-fuse units 202, 204, and 206 shown in FIG. 3 and a MOS transistor 702 which offers electrostatic discharge (ESD) protection. The e-fuse units 202, 204, and 206 are controlled by control signals $C_0$, $C_1$, $C_2$, respectively, and the MOS transistor 702 is controlled by a control signal $C_3$. When the e-fuse macro 602 is operated under a programming mode, a programming voltage (e.g., the reference voltage V1 being 3.3V or 2.5V) will be fed into the power connection node NP of the e-fuse macro 602, and the control signals $C_0$, $C_1$, $C_2$ generated from the e-fuse controller 606 decides what data should be recorded by the e-fuse macro 602. When the e-fuse macro 602 is operated under a read mode, the power connection node NP of the e-fuse macro 602 is floating, and the MOS transistor 702 controlled by a control signal $C_3$ is turned on to thereby provide the desired reference voltage V2 (e.g., a ground voltage) under the read mode.

Figure 6:
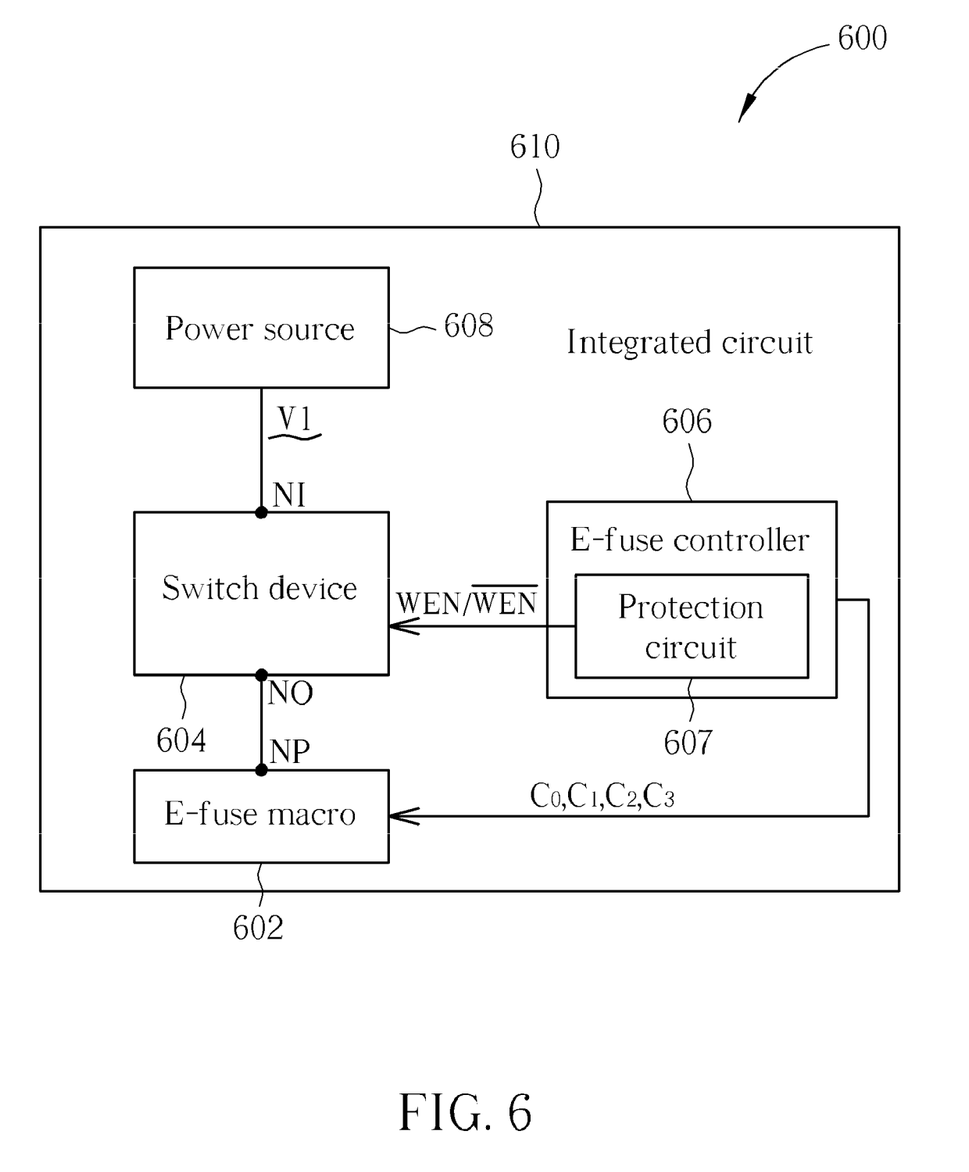
FIG. 6 is a diagram illustrating a second exemplary implementation of an e-fuse apparatus according to the present invention.
Figure 7:
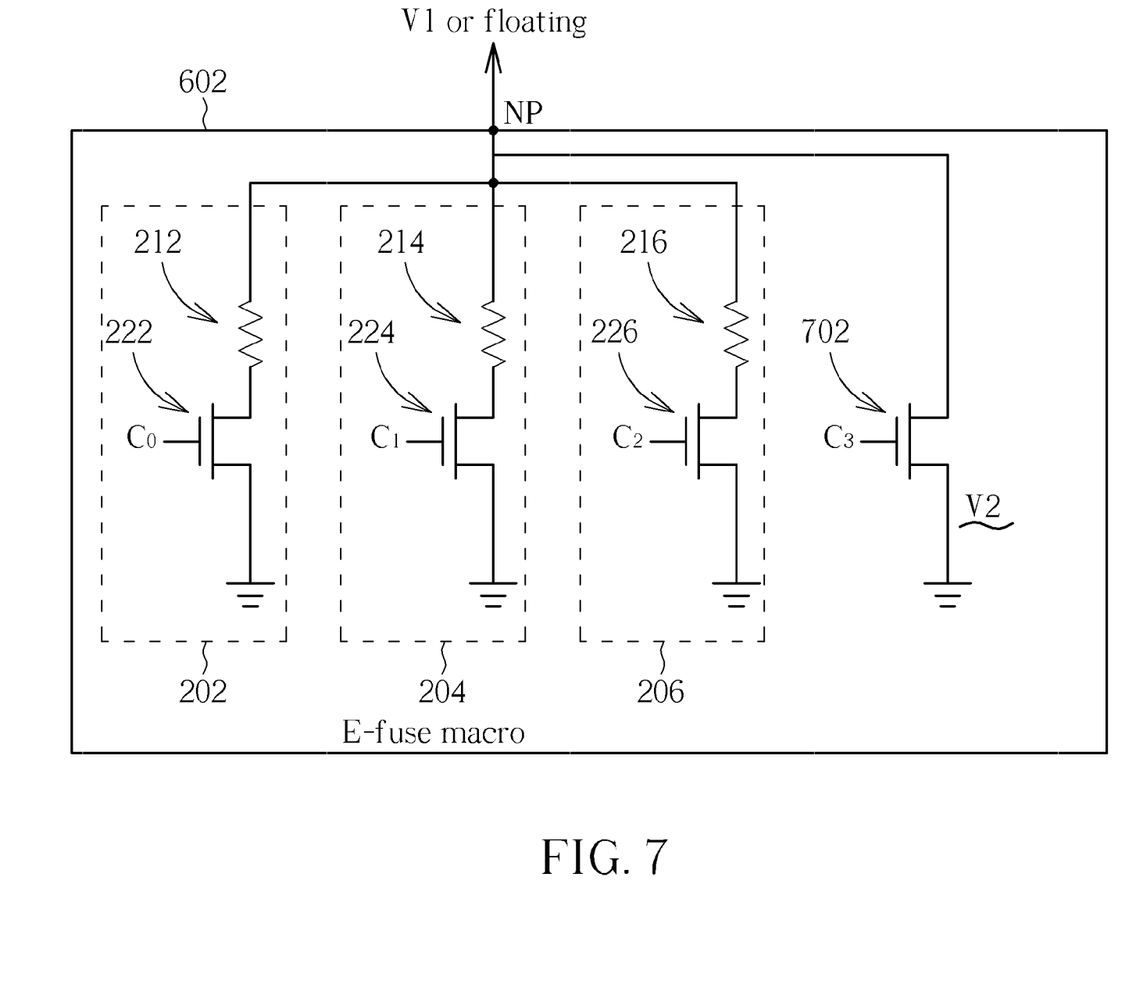
FIG. 7 is a diagram illustrating an exemplary embodiment of an e-fuse macro shown in FIG. 6.

As shown in FIG. 6, the switch device 604 has an output node NO coupled to a power connection node NP of the e-fuse macro 602 and a single input node NI coupled to the power source 608. In this exemplary embodiment, the switch device 604 is therefore implemented to connect the power source 608 to the e-fuse macro 602 when the e-fuse macro 602 is operated under the programming mode; however, when the e-fuse macro 602 is operated under a read mode, the switch device 604 disconnects the input node NI from the output node NO to thereby float the power connection node NP. By way of example, the switch device 604 can be simply implemented using one transmission gate (e.g., the transmission gate 402 shown in FIG. 4) controlled by control signals WEN/$\overline{\text{WEN}}$ generated from the e-fuse controller 606 or one MOS transistor (e.g., the PMOS transistor 502 shown in FIG. 5) controlled by a control signal WEN generated from the e-fuse controller 606.

Similar to the exemplary embodiment shown in FIG. 1, the e-fuse controller 606 in this exemplary embodiment shown in FIG. 6 also include an optional protection circuit 607 to prevent the switch device 604 from connecting the power source 608 to the e-fuse units 202, 204, 206 in the e-fuse macro 602 unless a predetermined criterion is met. As the function and operation of the protection circuit 607 are identical to that of the protection circuit 107, further description is omitted here for brevity.

In the exemplary embodiment shown in FIG. 1, the first power source 108 and the second power source 109 are both disposed in the integrated circuit 110; besides, in the exemplary embodiment shown in FIG. 6, the power source 608 is disposed in the integrated circuit 610. In this way, each of the integrated circuits 110, 610 does not need to reserve pin(s) for connecting external power sources. The pin count can be reduced. In addition, as the switch device 104, 604 is disposed in the integrated circuit 110, 610 for controlling the internal reference voltage supplied to the e-fuse macro 102, 602, no control circuit disposed outside of the integrated circuit 110, 610 is required to control the delivery of the reference voltage. Besides, the switch device 104, 604 in the integrated circuit 110, 610 is verified and guaranteed to have the capability of delivering the high electrical current needed to blow one or more programmable fuse elements under the programming mode as the e-fuse macro 102, 602 is formed in the same integrated circuit 110, 610. However, regarding the use of a control circuit which is disposed outside of the integrated circuit 110, 610 to control the delivery of the reference voltage, the external control circuit (e.g., an external switch device) may not meet the requirement of delivering such a high electrical current needed to blow one or more programmable fuse elements under the programming mode. That is, if the external control circuit is not properly selected, the programming failure of the e-fuse macro 102, 602 may occur. Moreover, the programming of the e-fuse macro 102, 602 can be done after the integrated circuit 110, 610 has been mounted on a circuit board of a target application due to the switch device 104, 604 disposed in the same integrated circuit 110, 610 where the e-fuse macro 102, 602 is located. Therefore, compared with conventional programming means, the programming operation of the e-fuse macro 102, 602 becomes easier and more efficient.

The exemplary embodiments shown in FIG. 1 and FIG. 6 are for illustrative purposes only. Any alternative design having the switch device disposed in an integrated circuit where the e-fuse macro is located still obeys the spirit of the present invention. For example, in other exemplary embodiments of the present invention, the power source for supplying the reference voltage required under the programming mode and/or the power source for supplying the reference voltage required under the read mode can be external to the integrated circuit where the e-fuse macro and the switch device are located. These also fall within the scope of the present invention. To put it simply, as long as the switch device used for controlling the delivery of the reference voltage supplied to the e-fuse macro is inside the integrated circuit, the e-fuse apparatus still benefits from such an innovative design having an internal switch device disposed in an integrated circuit (chip).

Figure 8:
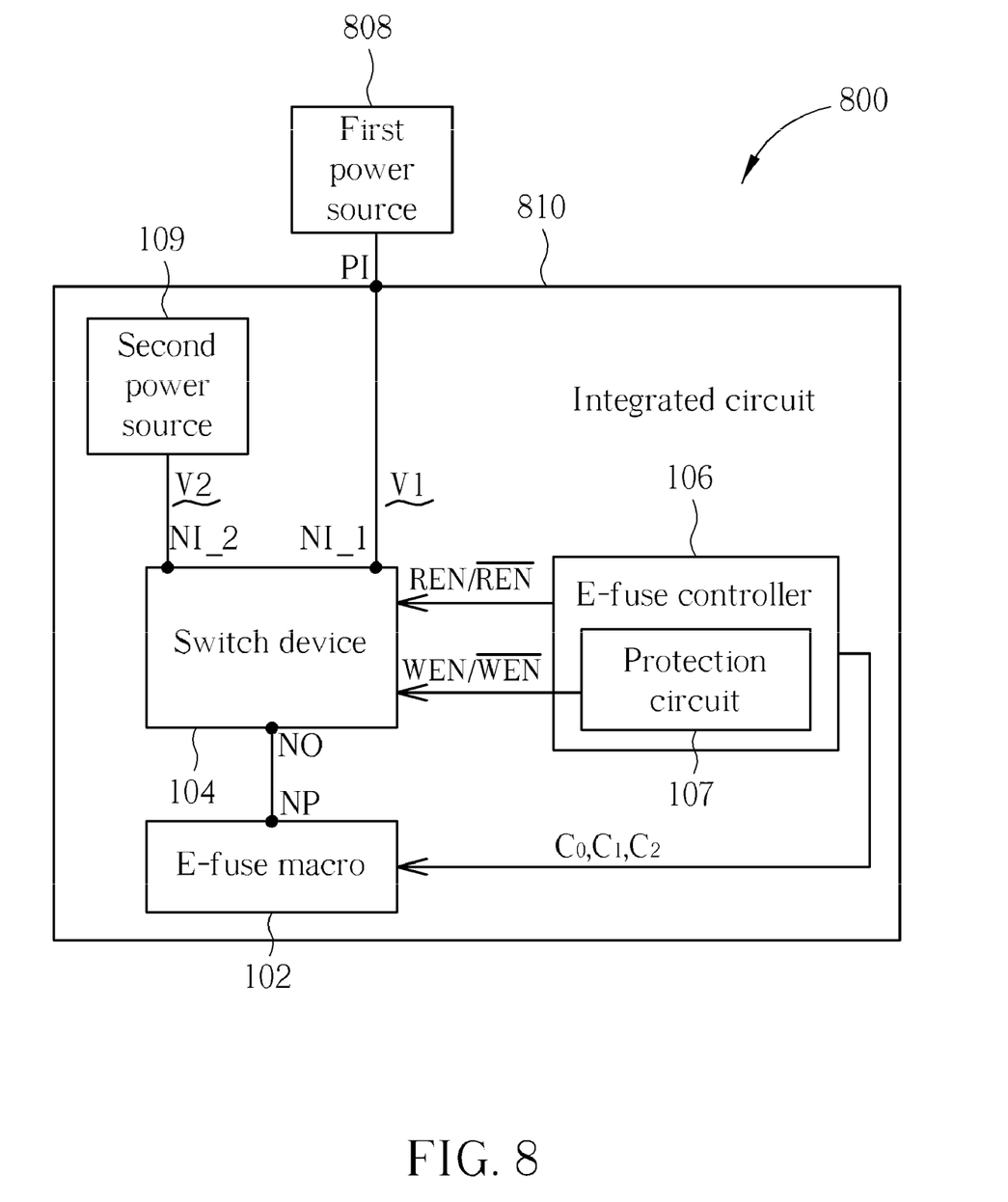
FIG. 8 is a diagram illustrating a third exemplary implementation of an e-fuse apparatus according to the present invention.

FIG. 8 is a diagram illustrating a third exemplary implementation of an e-fuse apparatus according to the present invention. The exemplary e-fuse apparatus 800 shown in FIG. 8 is similar to the exemplary e-fuse apparatus 100 shown in FIG. 1. The major difference is that the first power source 808 which supplies the first reference voltage V1 is external to the integrated circuit 810 where the switch device 104 is located. Therefore, the first input node NI_1 of the switch device 104 is coupled to the first power source 808 via a specific pin PI of the integrated circuit 810. In one implementation, the first power source 808 is a constant voltage source which keeps outputting the first reference voltage V1 when enabled. Therefore, the protection circuit 107 is preferably implemented to provide the e-fuse macro 102 with programming protection. As a person skilled in the art can readily understand the function and operation of the components shown in FIG. 8 after reading above paragraphs directed to the exemplary embodiment shown in FIG. 1, further description is omitted for brevity.

Figure 9:
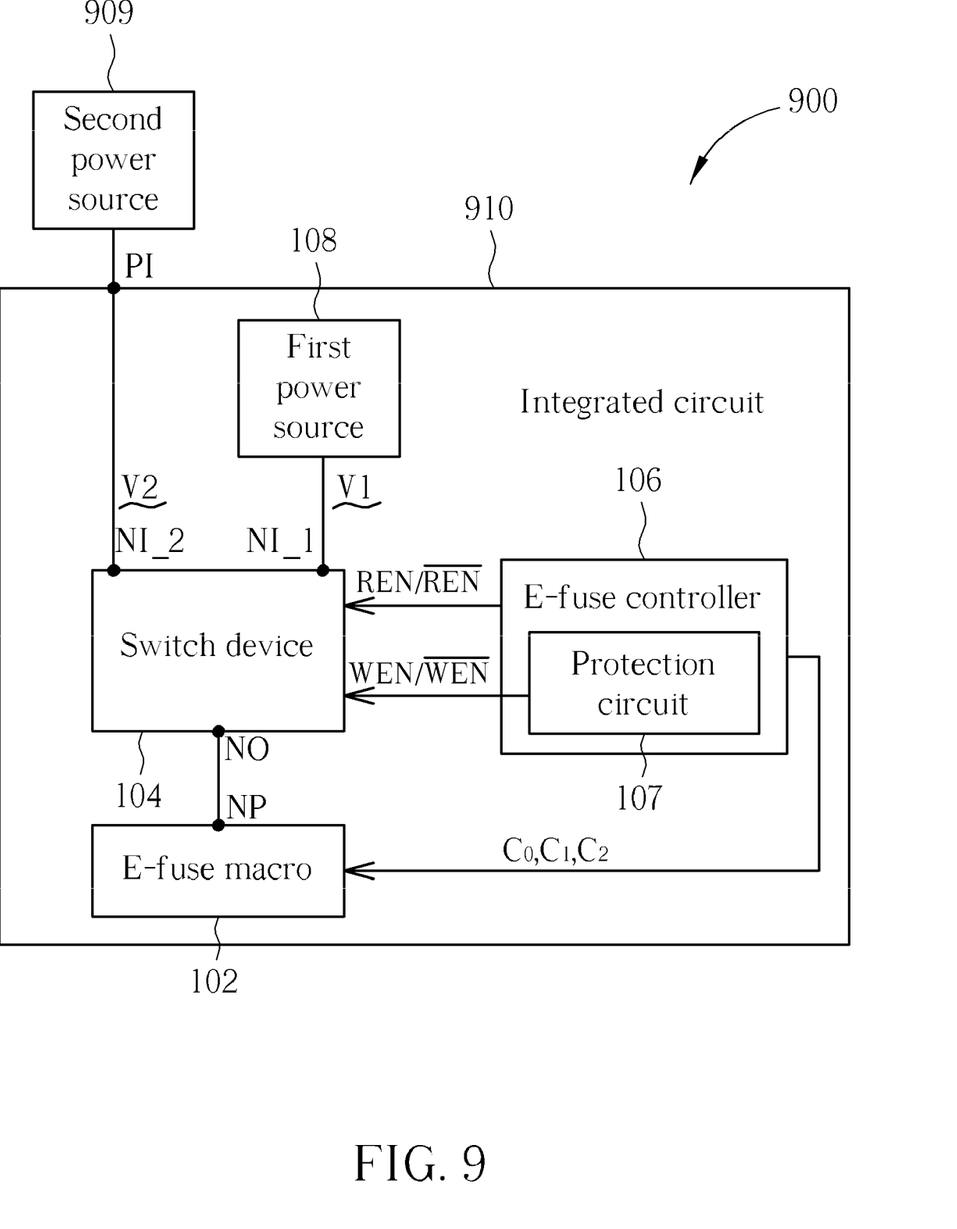
FIG. 9 is a diagram illustrating a fourth exemplary implementation of an e-fuse apparatus according to the present invention.

FIG. 9 is a diagram illustrating a fourth exemplary implementation of an e-fuse apparatus according to the present invention. The exemplary e-fuse apparatus 900 shown in FIG. 9 is similar to the exemplary e-fuse apparatus 100 shown in FIG. 1. The major difference is that the second power source 909 which supplies the second reference voltage V2 is external to the integrated circuit 910 where the switch device 104 is located. Therefore, the second input node NI_2 of the switch device 104 is coupled to the second power source 909 via a specific pin PI of the integrated circuit 910. In one implementation, the internal first power source 108 is a constant voltage source which keeps outputting the first reference voltage V1 when enabled. Therefore, the protection circuit 107 is preferably implemented to provide the e-fuse macro 102 with proper programming protection. As a person skilled in the art can readily understand the function and operation of the components shown in FIG. 9 after reading above paragraphs directed to the exemplary embodiment shown in FIG. 1, further description is omitted for brevity.

Figure 10:
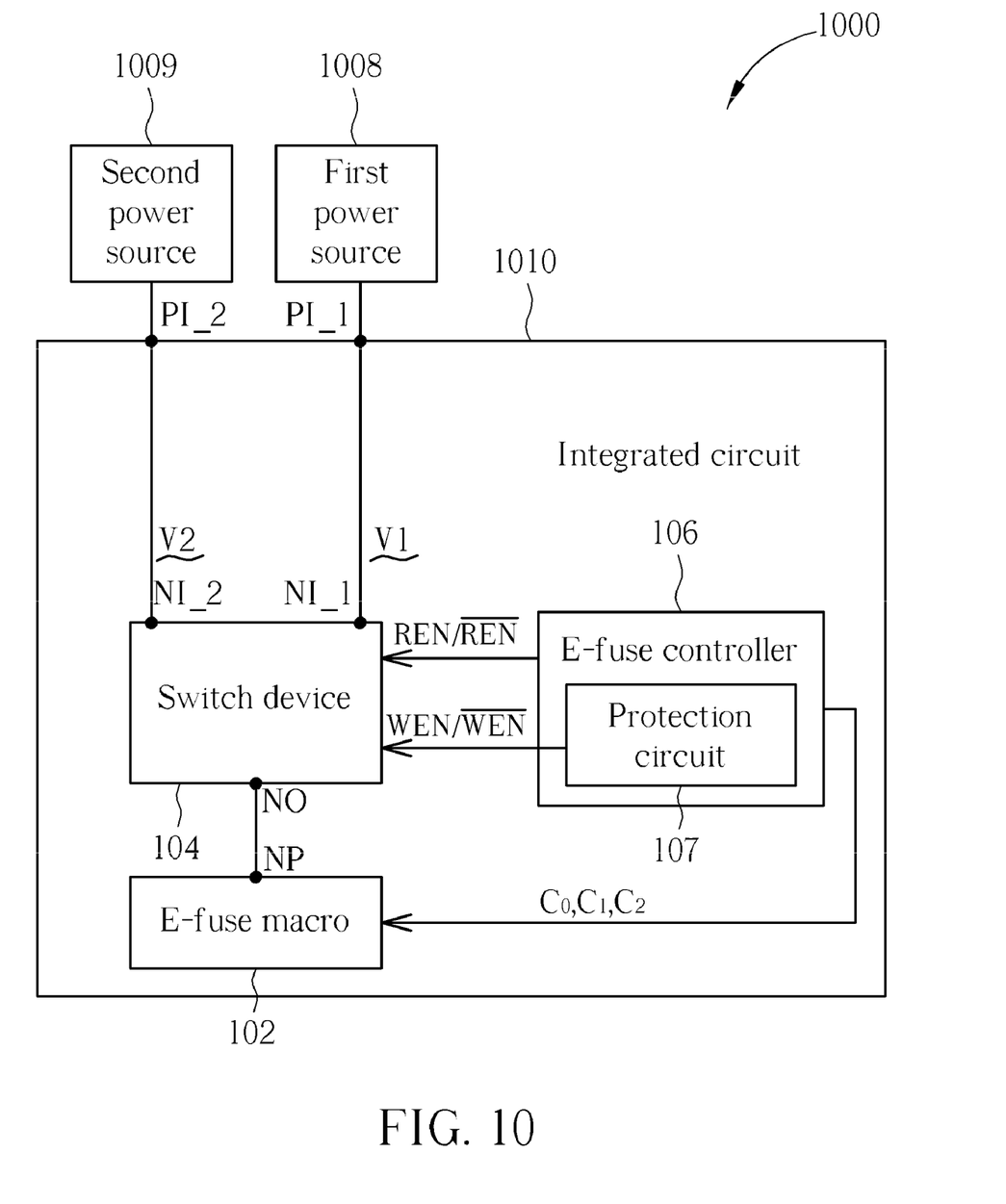
FIG. 10 is a diagram illustrating a fifth exemplary implementation of an e-fuse apparatus according to the present invention.

FIG. 10 is a diagram illustrating a fifth exemplary implementation of an e-fuse apparatus according to the present invention. The exemplary e-fuse apparatus 1000 shown in FIG. 10 is similar to the exemplary e-fuse apparatus 100 shown in FIG. 1. The major difference is that the first power source 1008 which supplies the first reference voltage V1 and the second power source 1009 which supplies the second reference voltage V2 are both external to the integrated circuit 1010 where the switch device 104 is located. In this exemplary embodiment, the first input node NI_1 of the switch device 104 is coupled to the first power source 1008 via a first specific pin PI_1 of the integrated circuit 1010, and the second input node NI_2 of the switch device 104 is coupled to the second power source 1009 via a second specific pin PI_2 of the integrated circuit 1010. In one implementation, the first power source 1008 is a constant voltage source which keeps outputting the first reference voltage V1 when enabled. Therefore, the protection circuit 107 is preferably implemented to provide the e-fuse macro 102 with proper programming protection. As the function and operation of other components shown in FIG. 10 are described in above paragraphs directed to the exemplary embodiment shown in FIG. 1, further description is omitted for brevity.

Figure 11:
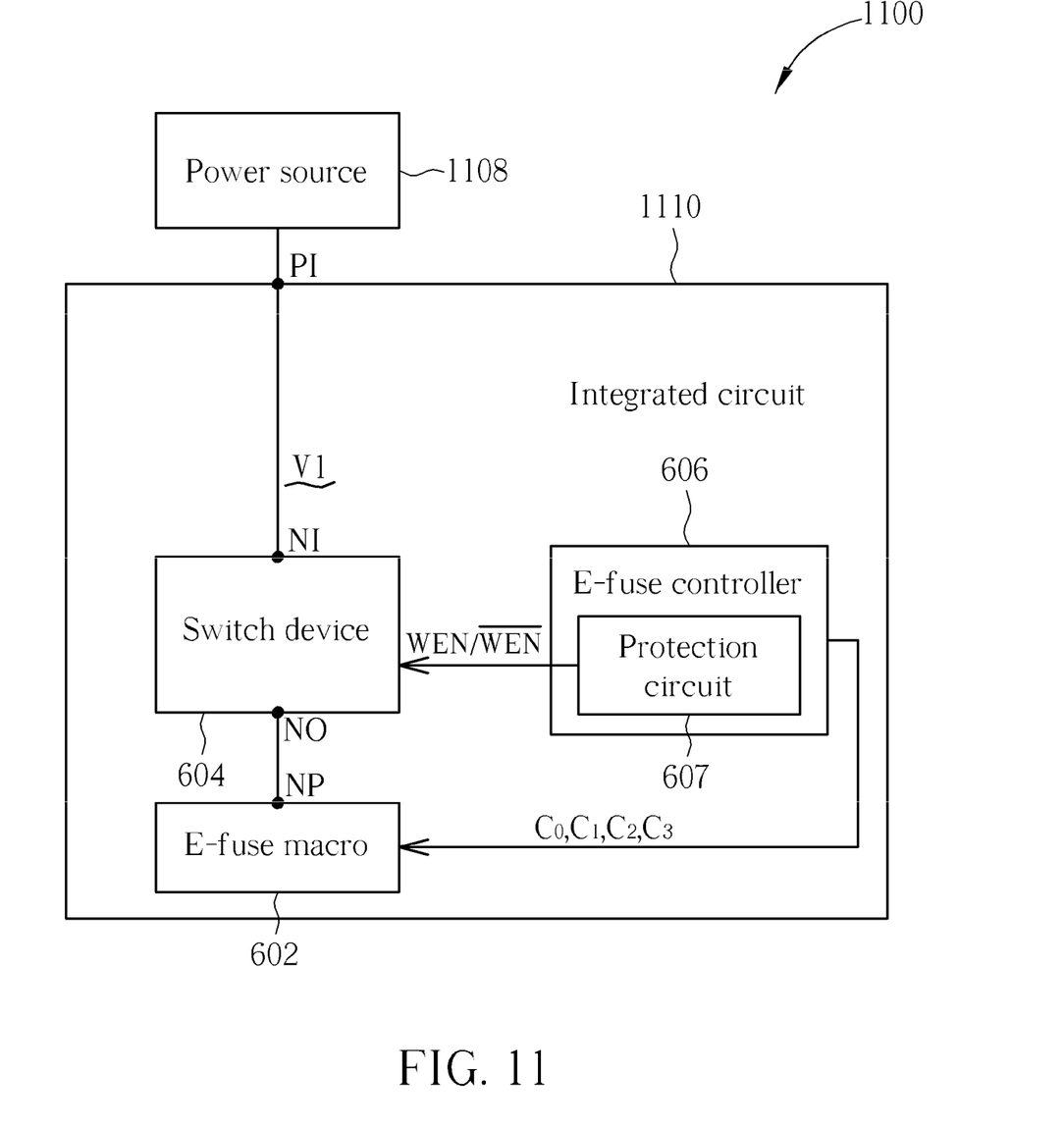
FIG. 11 is a diagram illustrating a sixth exemplary implementation of an e-fuse apparatus according to the present invention.

FIG. 11 is a diagram illustrating a sixth exemplary implementation of an e-fuse apparatus according to the present invention. The exemplary e-fuse apparatus 1100 shown in FIG. 11 is similar to the exemplary e-fuse apparatus 600 shown in FIG. 6. The major difference is that the power source 1108 which supplies the reference voltage V1 is external to the integrated circuit 1110 where the switch device 604 is located. Therefore, the input node NI of the switch device 604 is coupled to the power source 1108 via a specific pin PI of the integrated circuit 1110. In one implementation, the power source 1108 is a constant voltage source which keeps outputting the reference voltage V1 when enabled. Therefore, the protection circuit 607 is preferably implemented to provide the e-fuse macro 602 with proper programming protection. As a person skilled in the art can readily understand the function and operation of the components shown in FIG. 11 after reading above paragraphs directed to the exemplary embodiment shown in FIG. 6, further description is omitted for brevity.

Those skilled in the art will readily observe that numerous modifications and alterations of the device and method may be made while retaining the teachings of the invention.

What is claimed is:

1. An electrically programmable fuse (e-fuse) apparatus, comprising:
    an e-fuse macro, disposed in an integrated circuit and comprising a plurality of e-fuse units; and
    a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode; the first power source is inside the integrated circuit; the e-fuse macro has a power connection node coupled to the output node of the switch device and configured to receive the first reference voltage; when the e-fuse macro is operated under the programming mode, the switch device connects the first input node to the power connection node; and when the e-fuse macro is operated under a read mode to output stored bits, the switch device disconnects the first input node from the power connection node to float the power connection node such that no reference voltage external to the e-fuse macro is supplied to the e-fuse macro via the power connection node.

2. An electrically programmable fuse (e-fuse) apparatus, comprising:
    an e-fuse macro, disposed in an integrated circuit and comprising a plurality of e-fuse units; and
    a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode, wherein the first power source is inside the integrated circuit; the switch device further has a second input node coupled to a second power source; the switch device connects the second power source to the e-fuse units when the e-fuse macro is operated under a read mode; and the second power source is inside the integrated circuit, and supplies a second reference voltage different from the first reference voltage.

3. The e-fuse apparatus of claim 2, wherein the e-fuse macro has a power connection node coupled to the output node of the switch device and configured to receive either the first reference voltage or the second reference voltage; and the switch device comprises:
    a first transmission gate, coupled between the first input node and the power connection node, wherein the first transmission gate is turned on when the e-fuse macro is operated under the programming mode; and
    a second transmission gate, coupled between the second input node and the power connection node, wherein the second transmission gate is turned on when the e-fuse macro is operated under the read mode.

4. The e-fuse apparatus of claim 2, wherein the e-fuse macro has a power connection node coupled to the output node of the switch device and configured to receive either the first reference voltage or the second reference voltage; and the switch device comprises:
    a first transistor, coupled between the first input node and the power connection node, wherein the first transistor is turned on when the e-fuse macro is operated under the programming mode; and a second transistor, coupled between the second input node and the power connection node, wherein the second transistor is turned on when the e-fuse macro is operated under the read mode.

5. An electrically programmable fuse (e-fuse) apparatus, comprising:
   an e-fuse macro, disposed in an integrated circuit and comprising a plurality of e-fuse units; and
   a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode, wherein the first power source is inside the integrated circuit; the switch device further has a second input node coupled to a second power source; the switch device connects the second power source to the e-fuse units when the e-fuse macro is operated under a read mode; the second power source is external to the integrated circuit, and supplies a second reference voltage different from the first reference voltage; and the switch device is coupled to the second power source via a specific pin of the integrated circuit.

6. The e-fuse apparatus of claim 5, wherein the e-fuse macro has a power connection node coupled to the output node of the switch device and configured to receive either the first reference voltage or the second reference voltage; and the switch device comprises:
   a first transmission gate, coupled between the first input node and the power connection node, wherein the first transmission gate is turned on when the e-fuse macro is operated under the programming mode; and
   a second transmission gate, coupled between the second input node and the power connection node, wherein the second transmission gate is turned on when the e-fuse macro is operated under the read mode.

7. The e-fuse apparatus of claim 5, wherein the e-fuse macro has a power connection node coupled to the output node of the switch device and configured to receive either the first reference voltage or the second reference voltage; and the switch device comprises:
   a first transistor, coupled between the first input node and the power connection node, wherein the first transistor is turned on when the e-fuse macro is operated under the programming mode; and
   a second transistor, coupled between the second input node and the power connection node, wherein the second transistor is turned on when the e-fuse macro is operated under the read mode.

8. An electrically programmable fuse (e-fuse) apparatus, comprising:
   an e-fuse macro, disposed in an integrated circuit and comprising a plurality of e-fuse units; and
   a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode, wherein the first power source is external to the integrated circuit, and supplies the first reference voltage; the switch device is coupled to the first power source via a specific pin of the integrated circuit; the e-fuse macro has a power connection node coupled to the output node of the switch device and configured to receive the first reference voltage; when the e-fuse macro is operated under the programming mode, the switch device connects the first input node to the power connection node; and when the e-fuse macro is operated under a read mode, the switch device disconnects the first input node from the power connection node to float the power connection node such that no reference voltage external to the e-fuse macro is supplied to the e-fuse macro via the power connection node.

9. An electrically programmable fuse (e-fuse) apparatus, comprising:
   an e-fuse macro, disposed in an integrated circuit and comprising a plurality of e-fuse units; and
   a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode, wherein the first power source is external to the integrated circuit, and supplies the first reference voltage; the switch device is coupled to the first power source via a specific pin of the integrated circuit; the switch device further has a second input node coupled to a second power source; the switch device connects the second power source to the e-fuse units when the e-fuse macro is operated under a read mode; and the second power source is inside the integrated circuit, and supplies a second reference voltage different from the first reference voltage.

10. The e-fuse apparatus of claim 9, wherein the e-fuse macro has a power connection node coupled to the output node of the switch device and configured to receive either the first reference voltage or the second reference voltage; and the switch device comprises:
   a first transmission gate, coupled between the first input node and the power connection node, wherein the first transmission gate is turned on when the e-fuse macro is operated under the programming mode; and
   a second transmission gate, coupled between the second input node and the power connection node, wherein the second transmission gate is turned on when the e-fuse macro is operated under the read mode.

11. The e-fuse apparatus of claim 9, wherein the e-fuse macro has a power connection node coupled to the output node of the switch device and configured to receive either the first reference voltage or the second reference voltage; and the switch device comprises:
   a first transistor, coupled between the first input node and the power connection node, wherein the first transistor is turned on when the e-fuse macro is operated under the programming mode; and
   a second transistor, coupled between the second input node and the power connection node, wherein the second transistor is turned on when the e-fuse macro is operated under the read mode.

12. An electrically programmable fuse (e-fuse) apparatus, comprising:
   an e-fuse macro, disposed in an integrated circuit and comprising a plurality of e-fuse units; and
   a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode, wherein the first power source is external to the integrated circuit, and supplies the first reference voltage; the switch device is coupled to the first power source via a specific pin of the integrated circuit; the switch device further has a second input node coupled to a second power source; the switch device connects the second power source to the e-fuse units when the e-fuse macro is operated under a read mode; the second power source is external to the integrated circuit, and supplies a second reference voltage different from the first reference voltage; and the switch device is coupled to the second power source via another specific pin of the integrated circuit.

13. The e-fuse apparatus of claim 12, wherein the e-fuse macro has a power connection node coupled to the output node of the switch device and configured to receive either the first reference voltage or the second reference voltage; and the switch device comprises:
   a first transmission gate, coupled between the first input node and the power connection node, wherein the first transmission gate is turned on when the e-fuse macro is operated under the programming mode; and
   a second transmission gate, coupled between the second input node and the power connection node, wherein the second transmission gate is turned on when the e-fuse macro is operated under the read mode.

14. The e-fuse apparatus of claim 12, wherein the e-fuse macro has a power connection node coupled to the output node of the switch device and configured to receive either the first reference voltage or the second reference voltage; and the switch device comprises:
   a first transistor, coupled between the first input node and the power connection node, wherein the first transistor is turned on when the e-fuse macro is operated under the programming mode; and
   a second transistor, coupled between the second input node and the power connection node, wherein the second transistor is turned on when the e-fuse macro is operated under the read mode.

15. An electrically programmable fuse (e-fuse) apparatus, comprising:
   an e-fuse macro, disposed in an integrated circuit and comprising a plurality of e-fuse units;
   a switch device, disposed in the integrated circuit and having an output node coupled to the e-fuse units and a first input node coupled to a first power source which supplies a first reference voltage acting as a programming voltage of the e-fuse macro, wherein the switch device connects the first power source to the e-fuse units when the e-fuse macro is operated under a programming mode; and
   a protection unit, for preventing the switch device from connecting the first power source to the e-fuse units unless a password is inputted to the protection circuit to unlock programming protection.

16. An electrically programmable fuse (e-fuse) apparatus, comprising:
   an e-fuse macro, disposed in an integrated circuit and comprising a plurality of e-fuse units; and
   a switch device, disposed in the integrated circuit and having an output node coupled to the e-fuse units and an input node coupled to a power source which supplies a reference voltage, wherein the switch device connects the power source to the e-fuse units when the e-fuse macro is operated under a read mode to output stored bits, the power source is external to the integrated circuit, and the switch device is coupled to the power source via a specific pin of the integrated circuit.

* * * * *